United States Patent
Celii et al.

(10) Patent No.: US 7,985,603 B2
(45) Date of Patent: Jul. 26, 2011

(54) FERROELECTRIC CAPACITOR MANUFACTURING PROCESS

(75) Inventors: Francis Gabriel Celii, Dallas, TX (US); Robert Kraft, Plano, TX (US); Kezhakkedath R. Udayakumar, Dallas, TX (US); Scott Robert Summerfelt, Garland, TX (US); Theodore S. Moise, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/025,207

(22) Filed: Feb. 4, 2008

(65) Prior Publication Data
US 2009/0194801 A1    Aug. 6, 2009

(51) Int. Cl.
*H01L 21/00* (2006.01)
*H01L 21/02* (2006.01)

(52) U.S. Cl. ........................................... 438/3; 257/295
(58) Field of Classification Search .............. 438/3, 396, 438/710, 785; 257/295
See application file for complete search history.

(56) References Cited

U.S. PATENT DOCUMENTS

| 6,500,678 | B1 | 12/2002 | Aggarwal et al. |
| 6,569,777 | B1 * | 5/2003 | Hsu et al. ...................... 438/725 |
| 7,220,600 | B2 | 5/2007 | Summerfelt |
| 7,250,349 | B2 | 7/2007 | Celii |
| 2003/0059720 | A1 * | 3/2003 | Hwang et al. ................. 430/311 |
| 2004/0043526 | A1 * | 3/2004 | Ying et al. ...................... 438/38 |
| 2006/0134808 | A1 * | 6/2006 | Summerfelt et al. ............. 438/3 |

* cited by examiner

*Primary Examiner* — Calvin Lee
(74) *Attorney, Agent, or Firm* — Rose Alyssa Keagy; Wade J. Brady, III; Frederick J. Telecky, Jr.

(57) ABSTRACT

A method of manufacturing a semiconductor device. The method comprises forming conductive and ferroelectric material layers on a semiconductor substrate. The material layers are patterned to form electrodes and a ferroelectric layer of a ferroelectric capacitor, wherein a conductive residue is generated on sidewalls of the ferroelectric capacitor as a by-product of the patterning. The method also comprises removing the conductive residue using a physical plasma etch clean-up process that includes maintaining a substrate temperature that is greater than about 60° C.

18 Claims, 8 Drawing Sheets

FERROELECTRIC CAPACITOR MANUFACTURING PROCESS

TECHNICAL FIELD

The disclosure is directed, in general, to semiconductor devices, and more specifically, to methods for manufacturing ferroelectric capacitor structures in the fabrication of semiconductor devices.

BACKGROUND

Noble metals are increasingly used in the fabrication of various MEMS and IC semiconductor devices. E.g., noble metals are often used in the construction of components of dense arrays of capacitors used in ferroelectric memory cells (FRAM). Unfortunately, the patterning of such noble metals can be problematic. E.g., the etching of noble metals can leave behind a conductive by-product which short-circuits a device component. Consequently, capacitors that comprise components formed from patterned noble metals may not retain their charge because conductive by-products formed on sidewalls of the capacitor provide a route for current leakage.

SUMMARY

One embodiment of the disclosure provides a method of manufacturing a semiconductor device. The method comprises fabricating a ferroelectric capacitor. Fabricating the capacitor includes forming conductive and ferroelectric material layers on a semiconductor substrate. The conductive and ferroelectric material layers are patterned to form electrodes and a ferroelectric layer of a ferroelectric capacitor. A conductive residue is generated on sidewalls of the ferroelectric capacitor as a byproduct of the patterning. Fabricating the capacitor also includes removing the conductive residue using a physical plasma etch clean-up process that includes maintaining a substrate temperature that is greater than about 60° C.

Another embodiment comprises a method of manufacturing a ferroelectric memory cell. The method comprises forming one or more transistors on a semiconductor substrate and depositing a pre-metal dielectric layer over the transistors. The method also comprises fabricating a ferroelectric capacitor on the semiconductor substrate. The ferroelectric capacitor is electrically coupled to at least one of the transistors. Fabricating the ferroelectric capacitor includes the above-described patterning and removing steps.

Yet another embodiment manufacturing a ferroelectric memory cell comprises forming one or more transistors on a semiconductor substrate, depositing a pre-metal dielectric layer over the transistors, and forming contacts in the pre-metal dielectric layer, wherein the contacts touch at least one of the transistors. A diffusion barrier layer is formed on the pre-metal dielectric layer and on the contacts. A ferroelectric capacitor is fabricated on the diffusion barrier layer, wherein the ferroelectric capacitor is electrically coupled to at least one of the transistors. Fabricating the ferroelectric capacitor includes the above-described patterning and removing steps. The patterning and removing steps are performed in a same first chamber. The patterning and removing steps are completed prior to a second patterning of the diffusion barrier layer in a second chamber.

Still another embodiment comprises an integrated circuit. The integrated circuit comprises one or more ferroelectric memory cell. At least one of the memory cells includes one or more transistors on or in a semiconductor substrate, a pre-metal dielectric layer over the transistor and the above-described ferroelectric capacitor on the pre-metal dielectric layer, the ferroelectric capacitor being electrically coupled to at least one of the transistors.

DETAILED DESCRIPTION

Previous efforts to remove or clean-away conductive by-products resulting from the etching of noble metals in final capacitor structures have not been entirely successful, leading to lower-than-desired yields of devices. Embodiments of this disclosure introduce a clean-up step at an intermediate stage in the fabrication of a ferroelectric capacitor. It was discovered that introducing a clean-up step after etching a bottom electrode layer of the capacitor, but before etching an underlying barrier layer substantially decreased the extent of current leakage in the capacitors.

While not limiting the scope of the invention by theory, it is believed that the clean-up step removes conductive residues deposited on sidewalls of the capacitor. It is surprising that introducing a clean-up step at an intermediate stage in the fabrication of the capacitor would be so effective, because additional subsequent fabrication steps could deposit additional conductive residues on the sidewalls. Again, while not limiting the scope of the invention by theory, it is believed that such subsequent fabrication steps may coat the conductive residue with additional residue, thereby hindering the removal of the conductive residue by a subsequent clean-up performed after etching additional layers of the capacitor.

Figure 1:
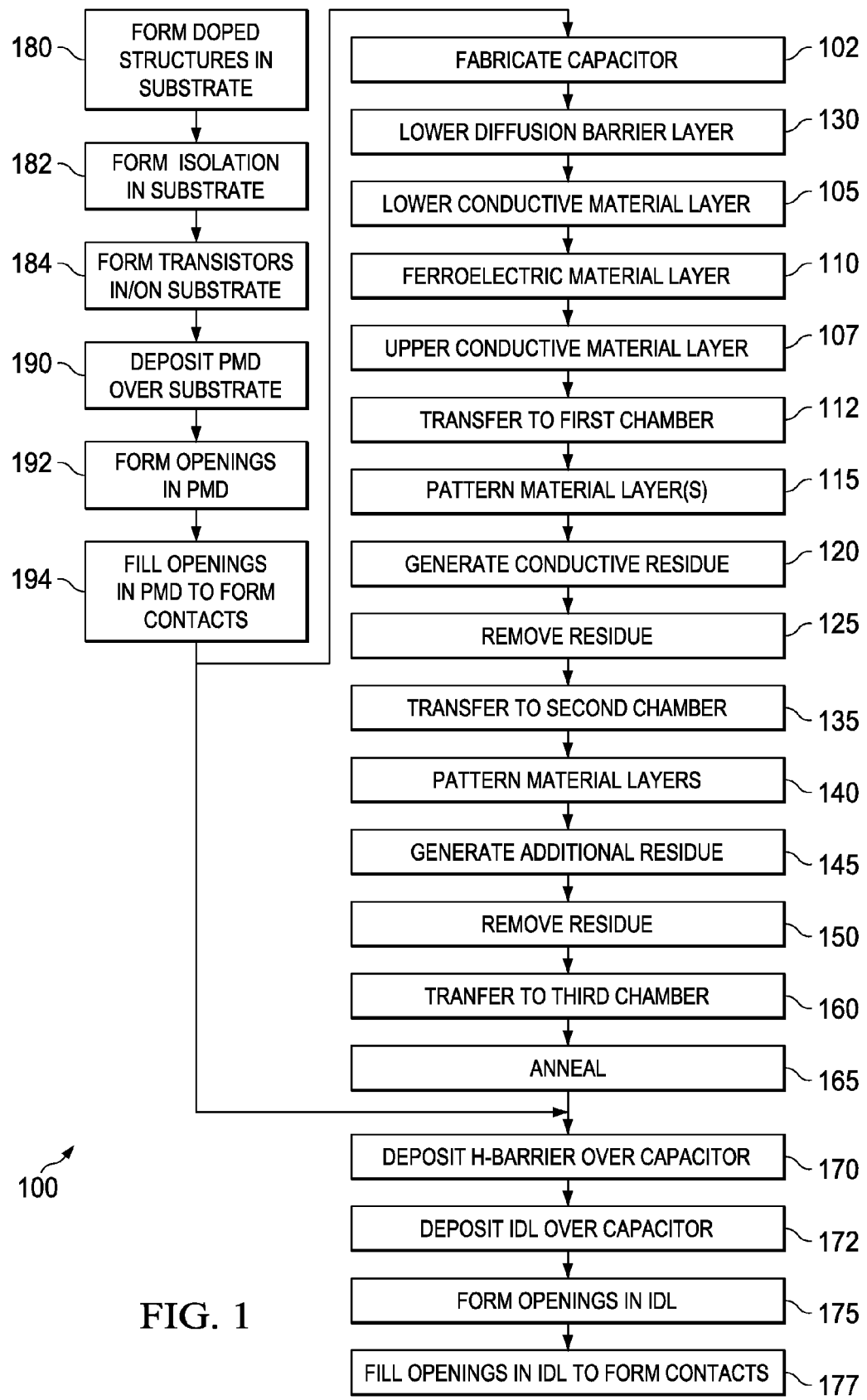
FIG. 1 is a flow diagram illustrating a method for fabricating semiconductor devices in which one or more aspects of the disclosure can be applied.

One embodiment of the disclosure is a method of manufacturing a semiconductor device. FIG. 1 is a flow diagram illustrating an example method 100 for fabricating semiconductor devices in which one or more aspects of the disclosure can be applied. The method can include fabricating a capacitor (e.g., a ferroelectric capacitor) (step 102). As part of fabricating the capacitor, the method 100 can comprise forming conductive (step 105, 107) and ferroelectric material layers (step 110) on a semiconductor substrate. As depicted in FIG. 1, the layers can be formed in the sequence: form first conductive material layer (105), form ferroelectric material layers (step 110), and then form first conductive material layer (step 107). The substrate can then be transferred to a first chamber (step 112) of a plasma etching tool. The conductive material layers and ferroelectric material layer are patterned (step 115) to form electrodes (e.g., top and bottom electrodes) and a ferroelectric layer of a ferroelectric capacitor. The patterning step 115 can include a plasma etch process (e.g., reactive ion etching, RIE). As a by-product of the patterning step 115, a conductive residue can be generated (step 120) on the sidewalls of the ferroelectric capacitor.

The term conductive material layer, as used herein, refers to a metal containing layer that comprises one or more noble metal. E.g., the conductive material layers can comprise one or more pure, or oxides of, noble metals. Examples include Ir, $IrO_x$, Pt, Pd, $PdO_x$, Au, Ru, $RuO_x$, Rh, $RhO_x$, $LaSrCoO_3$, $(Ba,Sr)RuO_3$, $LaNiO_3$, $YBa_2Cu_3O_{7-x}$, $AgO_x$, or multilayered combinations thereof ($x \geq 1$). The term ferroelectric material layer, as used herein, refers to any material layer having a permanent electric dipole moment and whose polarization can be changed by application of an electric field. Examples include lead zirconate titanate (PZT), strontium bismuth tantalate (SBT), or other suitable materials well know to those skilled in the art.

The method 100 also comprises removing (step 125) the conductive residue using a physical plasma etch clean-up process. Some embodiments of the physical plasma etch clean-up process includes maintaining a substrate temperature that is greater than about 60° C. to facilitate the removal of the conductive residue.

The physical plasma etch clean-up process performed in step 125 is configured to not substantially alter the dimensions of the electrodes and ferroelectric layers of the capacitor that resulted from the patterning step 115. E.g., embodiments of the physical plasma etch clean-up process is done under conditions and for a duration that does not substantially decrease the thickness and lateral dimensions of the electrodes and ferroelectric layers (e.g., the thickness and lateral dimensions of these layers is decreased by less than about 5 percent)

In some embodiments the removing step 125 is conducted in a different chamber (or different plasma etching tool) as the patterning step 115. In other embodiments, however, the removing step 125 is conducted in a same chamber as the patterning step 115. Performing the patterning and removing steps 115, 125 in the same chamber has the advantage of not requiring an additional chamber (or different etching tool) and eliminating the time required to transfer the substrate from one chamber to another (or to a different etching tool).

In some cases, the substrate temperature during the physical plasma etch clean-up process during the removing step 125 is substantially equal (e.g., within about 1 percent) to a second substrate temperature during the patterning step 115. This advantageously avoids spending time to heat or cool the substrate to attain a different temperature before carrying out the removing step 125. E.g., consider embodiments where the substrate temperature during the patterning step 110 equals about 150° C. or greater. In such cases, the substrate temperature during the removing step 125 can be 150° C. or greater. A substrate temperature of 150° C. or greater is preferred in some cases because a plasma etching process of the patterning step 115 provides more vertical sidewalls for the capacitor. In some cases a substrate temperature of about 250° C. or less is preferred because when the patterning step 115 is conducted at temperatures above about 250° C., unacceptably high numbers of capacitors having short circuits are fabricated. Therefore in some preferred embodiments, the substrate temperature during the removing step 125 is maintained at a value in the range from greater than about 60° C. to 250° C. In other preferred embodiments, the substrate temperature during the removing step 125 is maintained at a value in the range from about 150° C. to 250° C.

As noted, the substrate temperature during the removing step 125 can be substantially the same, and carried out in the same chamber, as the patterning step 110. However, other plasma etching conditions during the removing step 125 can be different than during the patterning step 110. Typically, one or more of the plasma etching conditions used during the removing step 125 are milder than the analogous condition used during the patterning step 110 so that the dimensions of capacitor are not substantially altered.

For instance, one or more of the feed gases, power, substrate bias, or duration can be altered during the removal step 125 as compared to the patterning step 110 to provide such milder conditions. E.g., the physical etch clean-up process of the removing step 125 may include a trihalide feed gas, such as boron trichloride (BCl$_3$) and an additional physical etch component, such as argon (Ar). In contrast, the patterning step 110 may not include the trihalide feed gas or physical etch component. E.g., the physical etch clean-up process of the removing step 125 may include a first radio frequency power that is less than a second radio frequency power used during the patterning step 110. E.g., the physical etch clean-up process of the removing step 125 may include a first substrate bias power that is less than a substrate bias power used during the patterning step 110. E.g., the duration of the physical etch clean-up process of the removing step 125 may be about 50 percent or less than the duration of a plasma etch using during the patterning step 110.

There can be additional steps to complete the construction of the ferroelectric capacitor. For instance, some embodiments of the method 100 further comprise a step 130 of forming diffusion barrier layer on the substrate, before forming the conductive and ferroelectric material layers (steps 105, 107, 110). Materials suitable for forming the diffusion barrier layer include metal nitrides, such as: TiAlN, TiSiN, TiN, TaAlN, TaSiN, TaN, HfN, ZrN, HfAlN, CrN, CrAlN, or multilayer combinations thereof. One skilled in the art would understand that similar additional barrier layers could be constructed both under and over the layers of the capacitor, if desired.

In some cases, the method 100 can also comprise transferring, in step 135, the substrate to a second chamber of the plasma etching tool (or to a chamber of a different tool) after completing the removing step 125. The diffusion barrier layer can then be patterned in step 140. That is, the physical plasma etch clean-up process of the removing step 125, as well as the patterning step 115, are both conducted and completed prior to patterning the diffusion barrier layer located under the conductive and ferroelectric material layers in step 140. Patterning the diffusion barrier layer in step 140 can include a plasma etch process that maintains the substrate at a third substrate temperature that is less than the substrate temperature during the removing step 110. E.g., in some instances, the third substrate temperature equals about 60° C. Using a lower temperature during step 140 helps to avoid inadvertently removing portions of other layers (e.g., a pre-metal dielectric layer) lying under the diffusion barrier layer. Additional residue (e.g., nitride-containing residue) can be formed (step 145) on sidewalls of the patterned conductive and ferroelectric material layers, as a byproduct of patterning of the diffusion barrier layer in step 140. The method 100 can further include removing the additional residue, in step 150, via second clean-up process (e.g., a standard rinse comprising phosphoric acid), in the second chamber.

After fabricating the capacitor, there can be several additional steps to complete the manufacture of the semiconductor device. Example manufacturing steps include: annealing the patterned capacitor (step 160), forming a conformal hydrogen barrier layer (H-barrier) over the capacitor (step 170), depositing an inter-level dielectric layer (ILD) over the capacitor (step 172), forming openings in the inter-level dielectric layer (step 175), and filling the openings with a conductive material (step 177) as part of forming contacts configured to electrically couple the ferroelectric capacitor to other components of the semiconductor device.

Similarly, the method 100 can further include several device manufacturing steps prior to forming the capacitor in step 102. Non-limiting examples include implanting dopants to form doped structures (e.g., doped wells) in the semiconductor substrate (step 180), forming isolation structures (step 182), such as shallow trench isolation or field oxide structures, in the substrates, and forming transistors (step 184) in or on the substrate. Additional manufacturing steps can include depositing a pre-metal dielectric (PMD) layer over the transistors (step 190), forming openings in the PMD layer (step 192) and filling the openings with a conductive material (step 194) to form contacts configured to electrically couple the transistor to each other or to capacitors of the device.

With continuing reference to FIG. 1, FIGS. 2-8 illustrate selected steps in an example method of manufacturing a semiconductor device in accordance with FIG. 1. The method steps of FIGS. 2-8 are presented in the context of manufacturing an IC 200 configured as a ferroelectric memory cell. However, one skilled in the art would understand how the method could be applied to the manufacture of any semiconductor device containing the components described herein.

Figure 2:
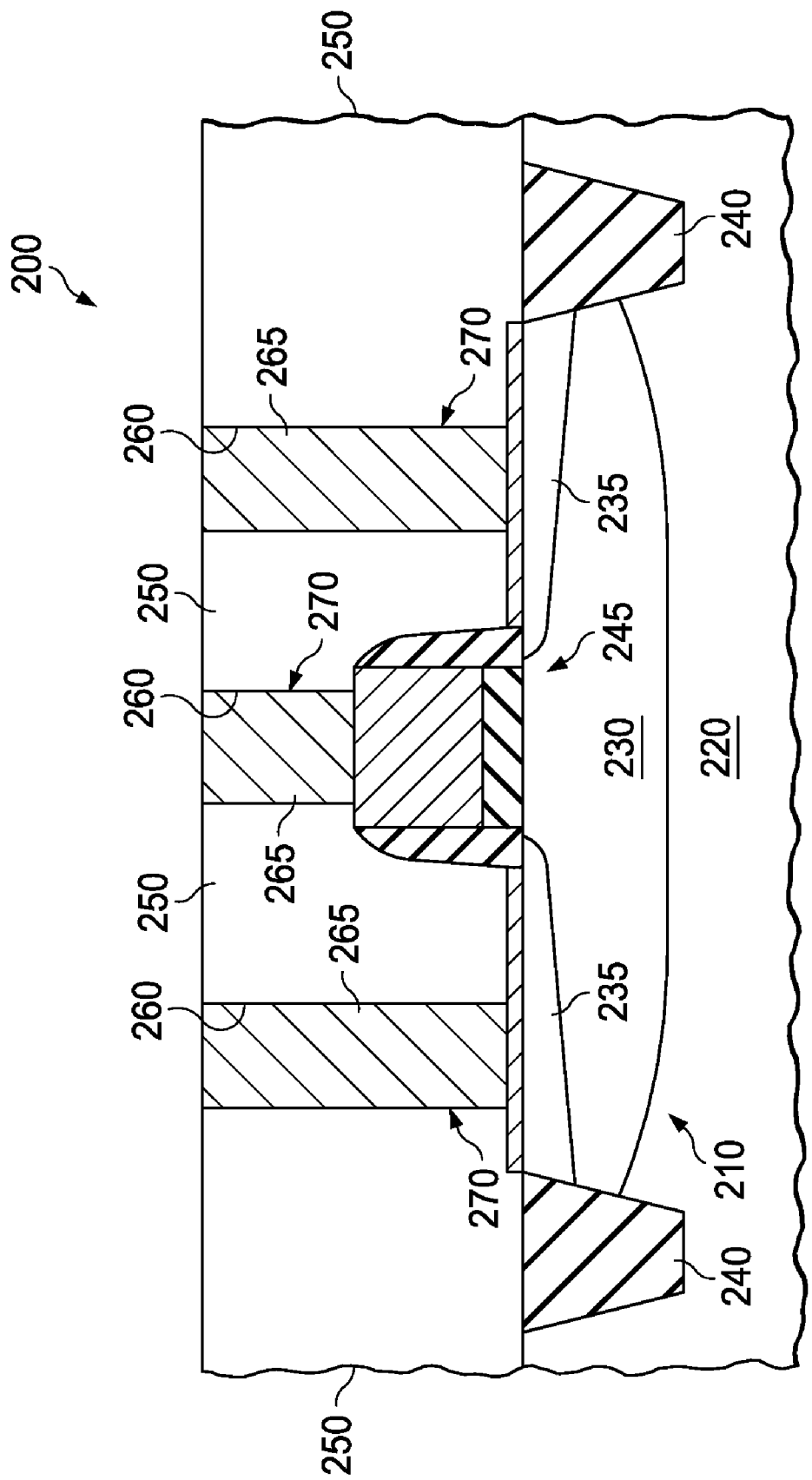
FIGS. 2 to 8 present cross-section views of selected steps in example implementation of a method of fabricating a semiconductor device comprising an integrated circuit according to the principles of the present disclosure.

FIG. 2 shows the IC 200 after forming one or more transistors 210 (e.g., nMOS, pMOS, CMOS transistors) on a semiconductor substrate 220 in accordance with step 184. Any conventional materials and methods can be used to form the transistors 210, such as discussed in U.S. Pat. No. 7,250, 349 by Celii et al. ("Celii"), U.S. Pat. No. 7,220,600 by Summerfelt et al. ("Summerfelt") or in U.S. Pat. No. 6,500, 678 to Aggarwal et al. ("Aggarwal"), which are incorporated herein by reference in their entirety. E.g., FIG. 2 also shows the IC 200 after forming doped wells 230, doped source and drain structures 235, shallow trench isolation structures 240, and transistor gate structures 245 in or on the substrate 220, in accordance with steps 180-184 and other step well known to those skilled in the art. Further examples of such steps are presented in Celii, Summerfelt or Aggarwal.

FIG. 2 also shows the IC 200 after depositing a pre-metal dielectric layer 250 over the substrate 220 and over the transistors 210 in accordance with step 190. FIG. 2 further shows the IC 200 after forming openings 260 in the pre-metal dielectric layer 250 and filling the openings 260 with a conductive material 265 to form a contact 270, in accordance with steps 192 and 194, respectively. As illustrated in FIG. 2, the contacts 270 touch the transistor 210 (e.g., source and drain regions 235 and gate structures 245 of individual transistors 210). Any suitable dielectric material and conductive material may be used for the pre-metal dielectric layer 250 (e.g., silicon dioxide), and contacts 270 (e.g., tungsten), respectively. Additional examples of suitable materials are presented in Celii, Summerfelt or Aggarwal.

Figure 3:
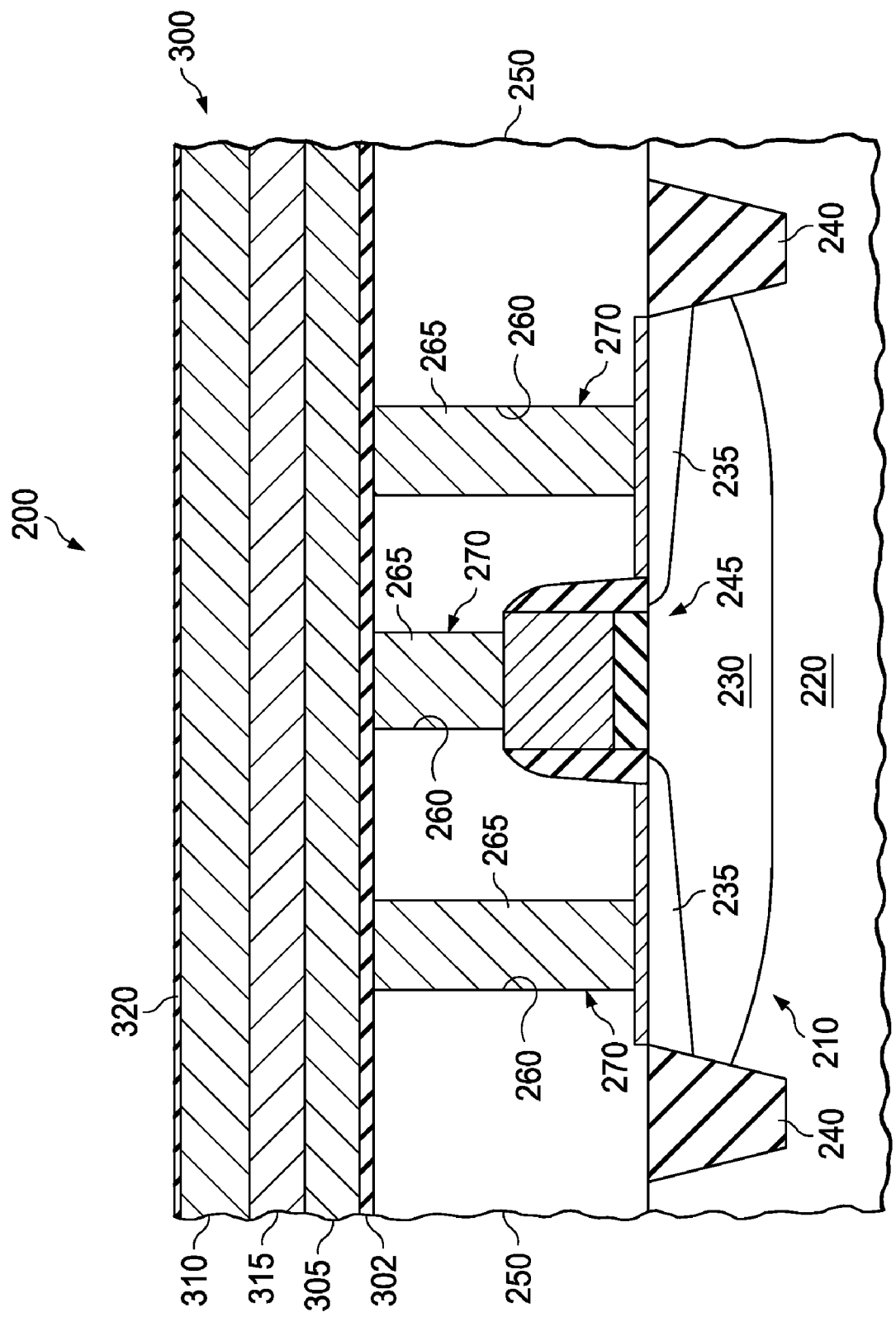
Figure 4:
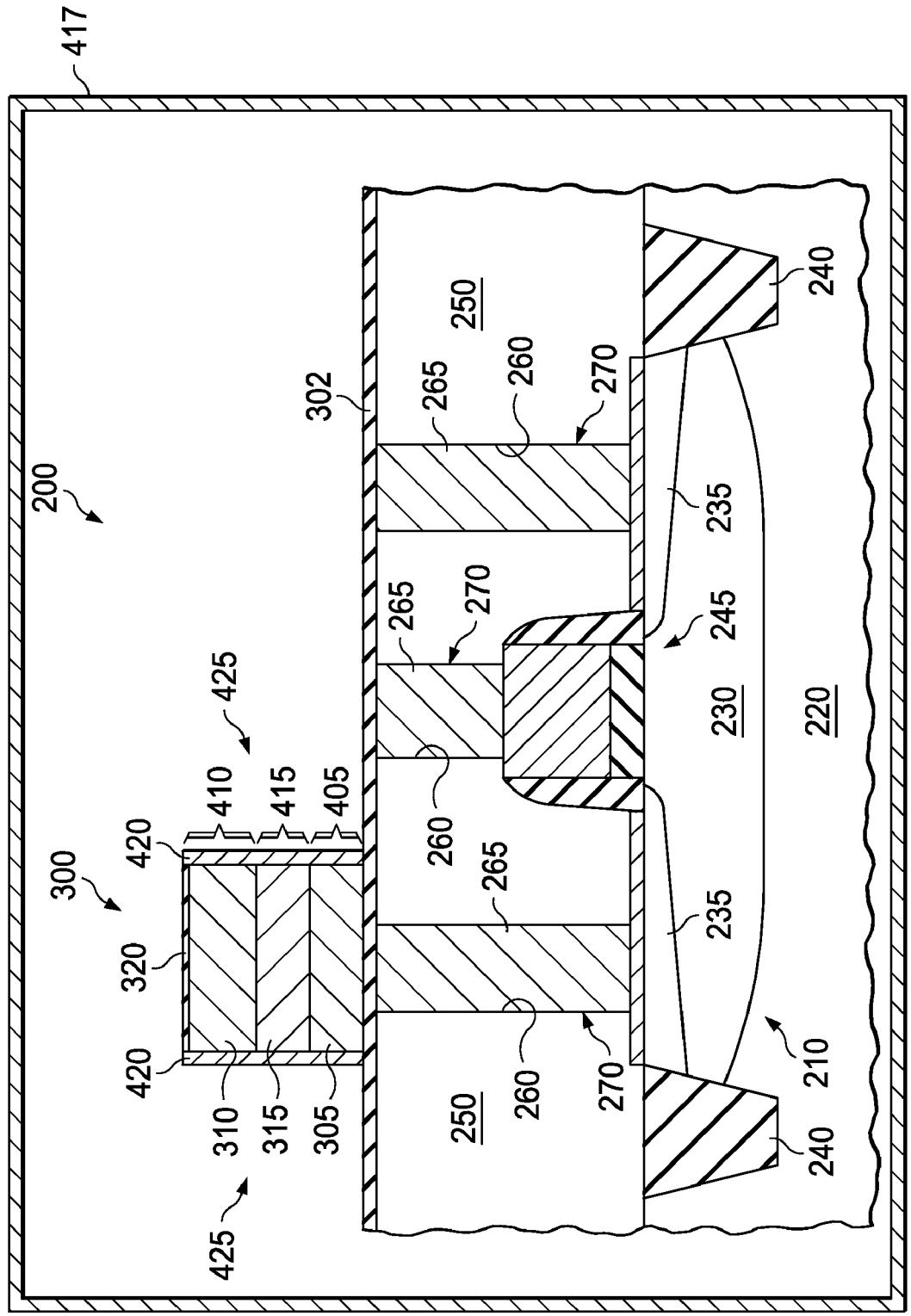
Figure 5:
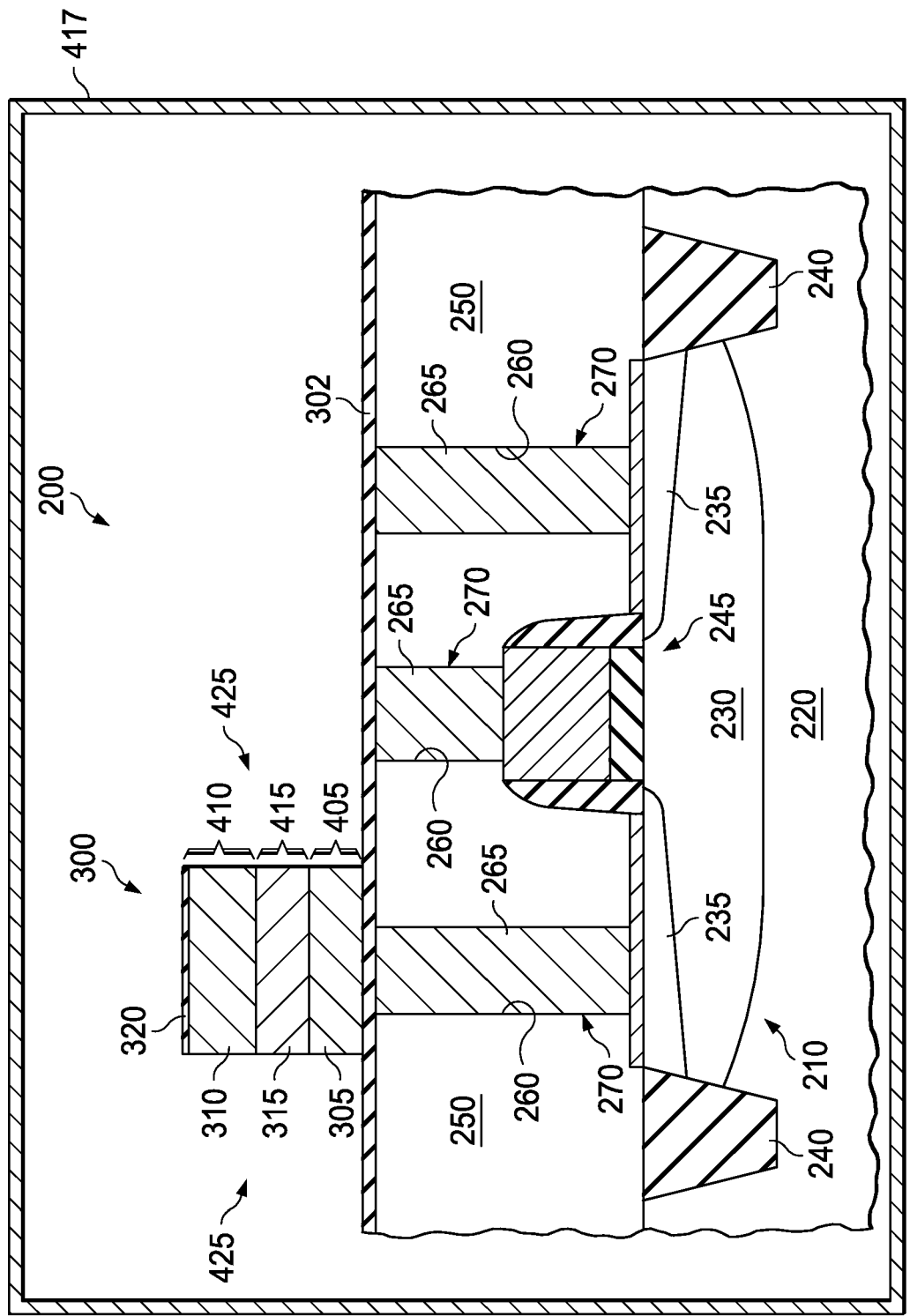

FIGS. 3-5 show steps in the fabrication of a ferroelectric capacitor 300 on the semiconductor substrate 220 in accordance with step 102. As shown in FIG. 3, in some embodiments, a lower diffusion barrier layer 302 (e.g., TiAlN) can be formed on the pre-metal dielectric layer 250 (step 130), prior to depositing conductive and ferroelectric material layers. E.g., forming the lower diffusion barrier layer 302 on the pre-metal dielectric layer 250 can include depositing the material of the barrier layer via chemical vapor deposition (CVD), physical vapor deposition (PVD), or other processes well known to those skilled in the art.

FIG. 3 also shows the IC 200 after forming lower and upper conductive material layers 305, 310 and ferroelectric material layer 315 on the pre-metal dielectric layer 250, in accordance with steps 105, 107 and step 110, respectively. Forming the lower conductive material layer 305 can include depositing (e.g., via CVD or PVD) a lower noble metal-containing material layer 305 (e.g., Ir) on the substrate 220 (e.g., directly on the diffusion barrier layer 302).

Forming the ferroelectric layer 315 on the lower conductive layers 305 can include depositing, via metal organic CVD, a ferroelectric material such as PZT. After forming the upper conductive material layer 310 on the ferroelectric layer 315, in some cases there is an additional step of depositing an upper diffusion barrier layer 320. The upper noble metal-containing material layer 310 and upper diffusion barrier layer 320 can comprise similar materials as used for the lower noble metal-containing material layer 305 and the lower diffusion barrier layer 302, respectively. Examples of additional suitable materials and deposition methods for forming the conductive and ferroelectric material layers 305, 310, 315 are presented in Celii, Summerfelt or Aggarwal.

FIG. 4 shows the IC 200 after patterning the material layers 305, 310, 315 (FIG. 3) in accordance with step 115, to form lower and upper electrodes 405, 410 and a ferroelectric layer 415 of the ferroelectric capacitor 300. E.g., as discussed in Celii, Summerfelt or Aggarwal, a hard mask (e.g., TiN, TiAlN, $SiO_2$ or other suitable material in single, or multilayered combinations), can be deposited and patterned to cover portions of the underlying material layers 305, 310, 315 for subsequent etching processes to form the capacitor 300. The upper and lower noble metal-containing material layers 305, 310 and ferroelectric material layer 315 can be etched (using e.g., reactive ion etching, RIE, processes) in separate etch processes and using separate hard masks, or they can be etched using a single process and single hard mask. As illustrated in FIG. 4 the substrate 220 is located in a first chamber 417 that is configured to perform the RIE process.

Example RIE processes to remove uncovered portions of the material layers 305, 310, 315 can include dry plasma etching using feed gases of halogens (e.g., $Cl_2$), either alone, or in combination with other feed gases (e.g., $O_2$, $N_2$). Different components of the capacitor require different etch chemistries. For instance, the RIE etch process for the ferroelectric material layer can comprises $Cl_2$, $O_2$, and a fluorocarbon gas ($CHF_3$). E.g., in some embodiments, plasma etching Ir-containing conductive layers 305, 310 comprises feed gases of $Cl_2:O_2:N_2$ in sccm ratios of about 140:45:18, an RF source power of about 1250 Watts and substrate bias power of about 450 Watts, and a chuck temperature (substantially equal to the substrate's temperature) of about 150° C. E.g., in some embodiments, plasma etching a PZT-containing ferroelectric layer 315 comprises feed gases of $Cl_2:O_2:CHF_3$ in sccm ratios of about 140:45:12, an RF source power of about 1200 Watts, a substrate bias power of about 450 Watts, and a chuck temperature of about 150° C. One skilled in the art would understand the range of different etchant chemistries could be adjusted depending on the composition of these material layers 305, 310, 315.

One skilled in the art would understand that the duration of the plasma etch of the conductive layers 305, 310 and ferroelectric layer 315 would depend upon the thickness of these layers. E.g., consider cases when conductive layers 305, 310 are about 50 nm thick and the ferroelectric layer 315 is about 90 nm thick. Plasma etching the conductive layers 305, 310 can range from about 60 to 80 seconds, while plasma etching the ferroelectric layer 315 can range from 50 to 70 seconds.

As further illustrated in FIG. 4, and in accordance with step 120, as a consequence of etching the material layers 305, 310, 315 a conductive residue 420 can be generated on sidewalls 425 of the ferroelectric capacitor 300, as a by-product of the patterning process. In some cases, e.g., the conductive residue 420 can be a noble metal-containing material. The conductive residue 420 can cover all or a portion of the sidewalls 425, and can have variable or uniform thickness.

FIG. 5 shows the IC 200 after removing the conductive residue 420 (FIG. 4) in accordance with step 125 using a physical plasma etch clean-up process. In some cases, the removal of the conductive residue 420 is performed in the same first chamber 417 that the above-described RIE processes were carried out in. The plasma etch clean-up process includes maintaining a substrate temperature (or equivalent chuck temperature) that is greater than about 60° C. In some cases, the physical etch process includes $BCl_3$ and Ar as a feed gases and the substrate temperature is about 150° C. or greater. Consider again, e.g., the above-described example where the electrodes 405, 410 and ferroelectric layer 415 comprise Ir and PZT, respectively. In such embodiments, the plasma etch clean-up process can include feed gases of $BCl_3$:Ar in sccm ratios of about 40:60, an RF source power of about 750 Watts, a substrate bias power of about 100 Watts, and a chuck temperature of about 150° C. In some cases, the duration of the removing step equals about 25 to 35 seconds.

The gas pressure used in the first chamber 417 during the physical plasma etch clean-up process depends upon the type of plasma generated. E.g., in some embodiments using a physical plasma etch produced by an inductively coupled plasma, the gas pressure in the first chamber 417 is maintained at a constant value of about 10 mTorr±10 percent throughout both the patterning and removing steps 115, 125. In other embodiments using a physical plasma etch produced by an electron cyclotron resonance plasma, the gas pressure in the first chamber 417 is maintained at a constant value of about 1 mTorr or less throughout both the patterning and removing steps 115, 125. In yet other embodiments using a physical plasma etch produced by a capacitively-coupled reactor, the gas pressure in the first chamber 417 is maintained at a constant value of about 30 to 100 mTorr throughout both the patterning and removing steps 115, 125. Such gas pressures are preferred because they facilitate the formation of suitable amount of physical component for the plasma etch clean-up process.

The removal of the conductive residue in accordance with step 125 can be confirmed by visual inspection of the completed or partially completed IC 200, as aided by suitable microscopic techniques (e.g., transmission electron microscopy). In some instances, the removal of the conductive residue can be indirectly assessed by measuring one or more electrical properties of the IC 200. E.g., in some cases the leakage current of the capacitors 300 manufactured in accordance with the present disclosure have a current density of less than about 0.1 Amp/cm$^2$ and in some cases, less than about 0.01 Amp/cm$^2$ for an applied voltage of 1.4 V. Such current leakage can be about 2 to 3 or more orders of magnitude lower as compared to a similarly sized but conventionally fabricated capacitor.

Figure 6:
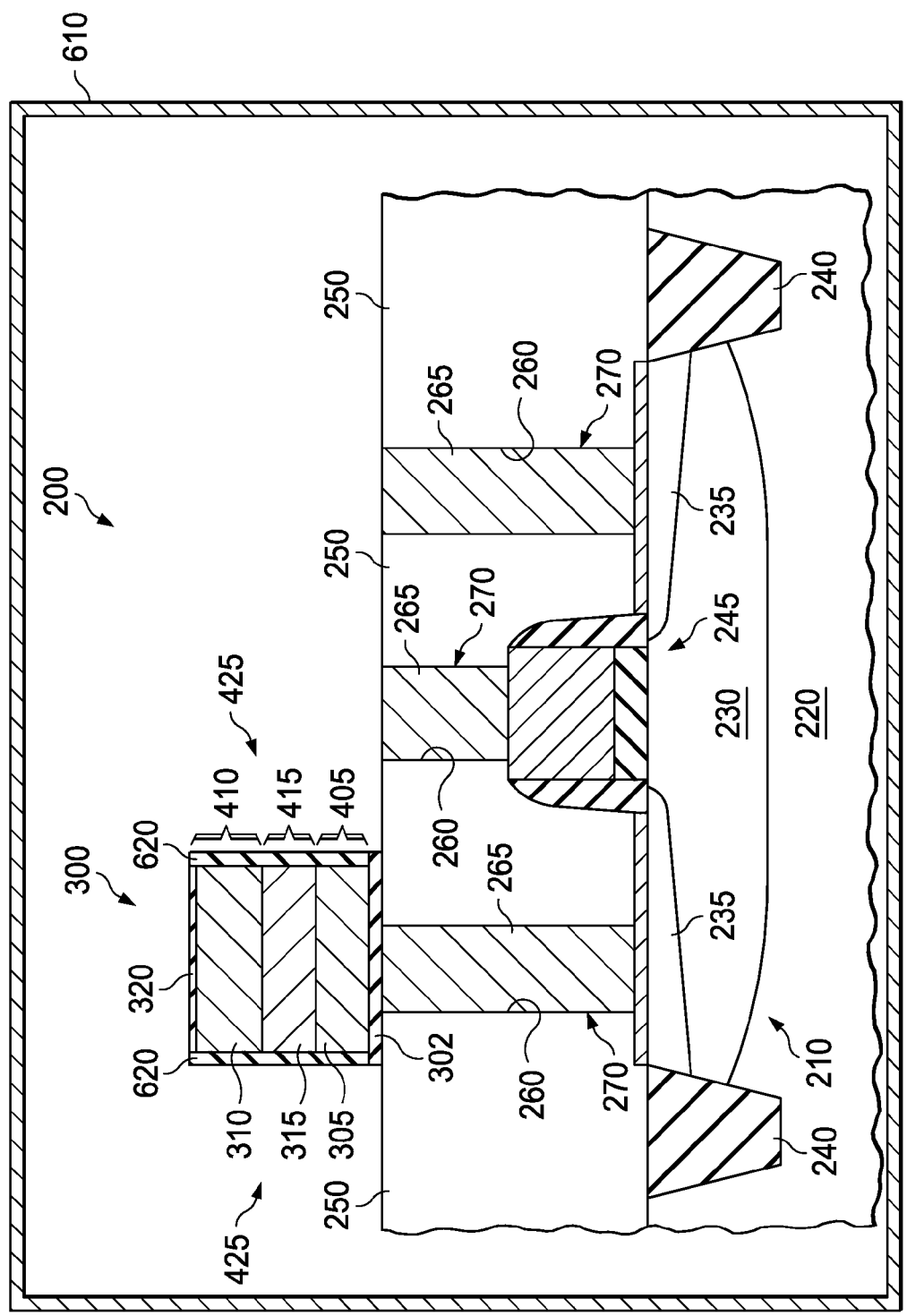

FIG. 6 shows the IC 200 after transferring the substrate 220 into a second chamber 610. The substrate is transferred from the first chamber 417 to the second chamber 610 after the removing step 125. In the second chamber 610, at least two steps can be sequentially performed: a second patterning of the barrier layer 302 in accordance with step 140 (FIG. 4) and a second removing of barrier layer residue 620 in accordance with step 145. FIG. 6 depicts the cell after performing the second patterning step 140, but before the second removing step 145. The barrier layer residue 620 is generated on sidewalls 425 of the capacitor 300 as a byproduct of the second patterning step 140. In cases where the barrier layer 302 comprises a metal nitride, the barrier layer residue 620 can be a metal nitride-containing residue.

The second patterning step 140 can comprise a plasma etch of the barrier layer 302 using a RIE process. Plasma etching the barrier layer 302 by the RIE process can comprise feed gases of $BCl_3$ and Ar and maintaining a substrate temperature of about 60° C. E.g., a RIE process to pattern a TiAlN barrier layer 302 can comprising feed gases of $BCl_3$:Ar in sccm ratios ranging from about 40:60 to 0:50, an RF source power of about 750 to 1000 Watts, a substrate bias power of about 100 to 150 Watts, and a substrate temperature of about 60° C.

Figure 7:
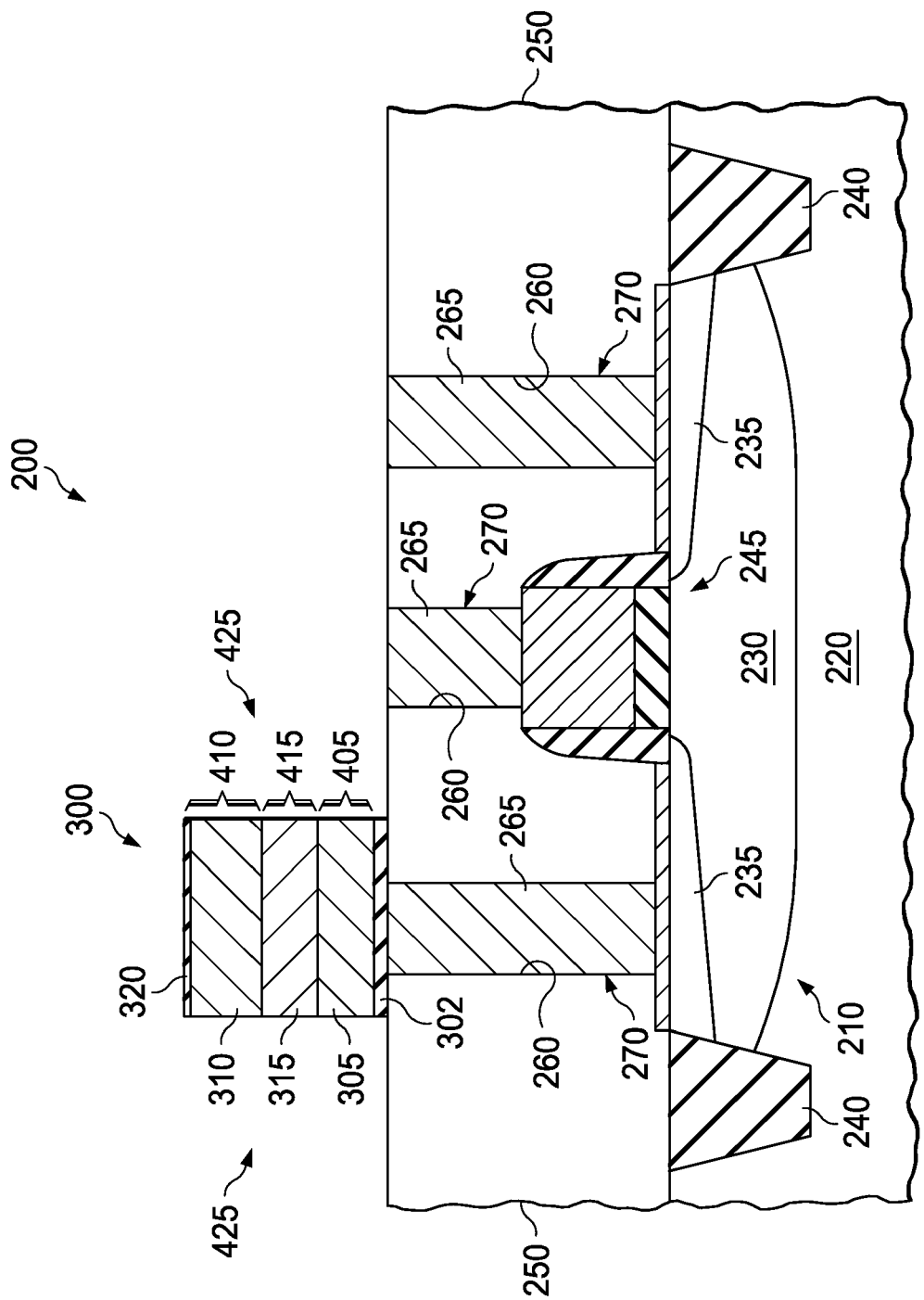

FIG. 7 shows the IC 200 after removing the barrier layer residue 620 (FIG. 6) in accordance with step 145. Removing the barrier layer residue 620 can comprise a second physical plasma etch clean-up process using a RIE process. In cases where the barrier layer residue 620 comprises a metal nitride, the RIE process can comprise feed gases of $BCl_3$ and Ar and maintaining a substrate temperature of about 60° C. E.g., the RIE process to clean up metal nitride-containing residue can include feed gases $BCl_3$:Ar in sccm ratios ranging from about 40:60 an RF source power of about 750 Watts, a substrate bias power of about 100 Watts, and a substrate temperature of about 60° C.

FIG. 7 also shows the IC 200 after performing an anneal in accordance with step 165. The anneal (step 160) improves the yield of capacitors having low leakage currents, such as discussed above. Example anneals in accordance with step 160 can include exposing the substrate 220 and capacitor 300 to an plasma process comprising one or more of $O_2$, $N_2$, $H_2O$ feed gases, and temperature ranging from about 250 to 350° C. and pressure ranging from about 1500 to 2500 mTorr. E.g., in some cases the anneal comprises feed gases of $O_2$:$N_2$:$H_2O$ in sccm ratios of 3500:200:300 at a temperature of about 300° C. and pressure of about 2000 mTorr, an RF source power of about 1400 Watts and no substrate bias power. The duration of some anneals in accordance with step 160 can range from about 3 to 5 minutes.

Figure 8:
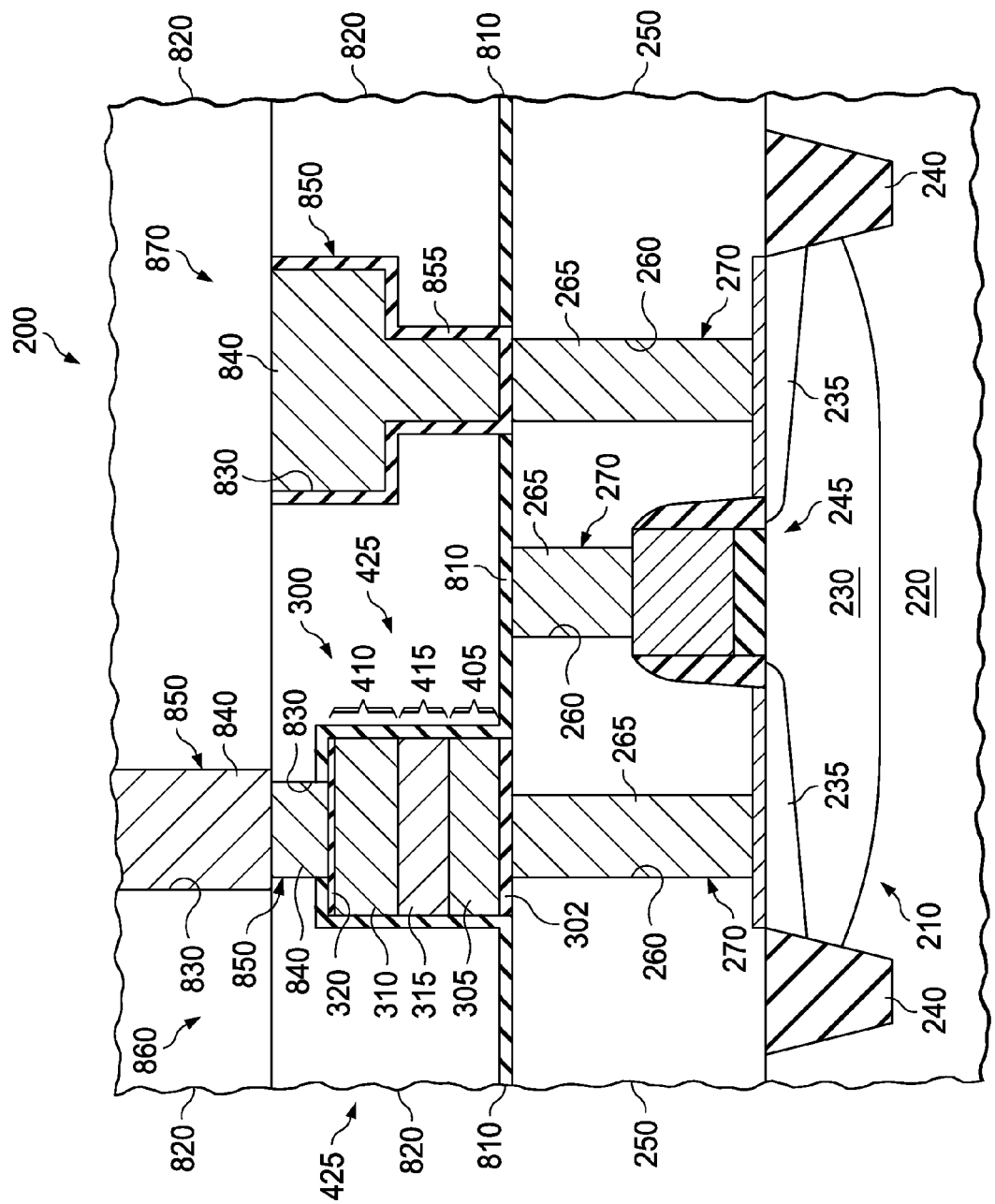

FIG. 8 shows the IC 200 after forming an optional hydrogen barrier layer 810 over the capacitor 300 in accordance with step 170. The hydrogen barrier layer 810 is formed after removing the conductive residue in step 125, and more preferably after removing the additional residue, in step 150, and the anneal, in step 165. The hydrogen barrier layer 810 can conformally cover the entire surface of the capacitor 300 as well as the metal dielectric layer 250. E.g., the hydrogen barrier layer 810 can comprise Aluminum Oxide and can be formed by Atomic Layer Deposition (ALD).

FIG. 8 also shows the IC 200 after depositing one or more inter-level dielectric (ILD) layers 820 on the substrate 220. As shown in FIG. 8, the ILD layers 820 can be formed on the capacitor 300 and pre-metal dielectric layer 250, in accordance with step 172. Each of the ILD layers 820 can comprise single or multi-layered combinations of insulating materials such as silicon oxide (e.g., $SiO_2$), fluorosilicate glass (FSG), phosphosilicate glass (PSG), or other low dielectric constant materials (e.g., dielectric constant of about 4 or less). The ILD layers 820 can be deposited using CVD, PVD, ALD or other conventional methods. Additional example materials and deposition processes are presented in Celii, Summerfelt or Aggarwal.

FIG. 8 further shows the IC 200 after forming openings 830 in the inter-level dielectric (step 175) (an optional hydrogen barrier layer 810), and filling the openings 830 with a conductive material 840 (step 177) to form contacts 850. Conventional patterning and etching methods can be used to form single or dual damascene openings 830. Suitable conductive material 840 includes Al, W or Cu, and can further include a metal diffusion barrier 855 (e.g., silicon carbide or silicon nitride) lining the opening 830. Other suitable contact material and methods of forming openings and forming contacts are presented in Celii, Summerfelt or Aggarwal.

The contacts 850 can be configured to electrically couple the ferroelectric capacitor 300 to other components of the IC 200. E.g., the ferroelectric capacitor 300 can be electrically coupled to at least one of the transistors 210 through one or more contacts 850. In some embodiments, one or more transistor 210 and the ferroelectric capacitor 300 are interconnected to form a memory cell 860.

Another embodiment of the disclosure is depicted in FIG. 8. The IC 200 comprises one or more memory cells 870, wherein at least one of the memory cells 870, includes one or more transistors 210 on or in a semiconductor substrate 220 and the one or more capacitor 300. The IC 800 further comprises a pre-metal dielectric layer 250 over or on the one or more transistors 210 and ferroelectric capacitor 300. The ferroelectric capacitor 300 is electrically coupled to at least one of the transistors 210. Embodiments of the IC 200 can be fabricated by any of the methods discussed above.

Those skilled in the art to which the invention relates will appreciate that other and further additions, deletions, substitutions and modifications may be made to the described example embodiments, without departing from the invention.

What is claimed is:

1. A method of manufacturing a semiconductor device, comprising:
   fabricating a ferroelectric capacitor including:
      forming conductive and ferroelectric material layers on a semiconductor substrate; and
      patterning said conductive and ferroelectric material layers to form upper and lower electrodes and a ferroelectric layer of said ferroelectric capacitor, wherein a conductive residue is generated on sidewalls of said ferroelectric capacitor as a byproduct of said patterning; and
   removing said conductive residue using a physical plasma etch clean-up process that includes $BCl_3$ as a feed gas.

2. The method of claim 1, wherein said substrate temperature is in a range of greater than about 60° C. to about 150° C.

3. The method of claim 1, wherein said substrate temperature has a value in the range from about 150 to 250° C.

4. The method of claim 1, wherein said removing is conducted in a same plasma etching tool as said patterning.

5. The method of claim 1, wherein said substrate temperature during said physical plasma etch clean-up process is substantially equal to a second substrate temperature during said patterning.

6. The method of claim 1, wherein said physical etch clean-up process also includes Ar as a feed gases.

7. The method of claim 6, wherein said $BCl_3$ feed-gas has a flow rate ranging from about 30 to 50 sccm and said Ar feed-gas has a flow rate ranging from about 50 to 70 sccm.

8. The method of claim 1, wherein said physical etch clean-up process includes a first radio frequency power that is less than a second radio frequency power used during said patterning and a first substrate bias that is less than a first substrate bias used during said patterning.

9. The method of claim 1, wherein said physical etch clean-up process includes a first substrate bias that is less than a second substrate bias used during said patterning.

10. The method of claim 1, wherein said physical etch clean-up process includes a first radio frequency power of about 750 Watts and a first substrate bias of about 100 Watts.

11. The method of claim 1, wherein said patterning includes an etch process having a second radio frequency power of about 1200 to 1250 Watts, and a second substrate bias of about 450 Watts.

12. The method of claim 1, further including forming a diffusion barrier layer on said substrate before forming said conductive and ferroelectric material layers.

13. The method of claim 12, wherein said diffusion barrier layer comprises a metal nitride and further including the steps of transferring said substrate into a second chamber after said removing, and performing in said second chamber a second patterning process on said metal nitride diffusion barrier layer located under said conductive and ferroelectric material layers, wherein a metal nitride-containing residue is generated on sidewalls of said ferroelectric capacitor as a byproduct of said second patterning process; and removing said metal nitride-containing residue using a second physical etch clean-up process that includes maintaining a substrate temperature of about 60° C.

14. The method of claim 1, further including transferring said substrate to a second chamber after said removing, and patterning a diffusion barrier layer located under said conductive and ferroelectric material layers, wherein said physical plasma etch clean-up process is conducted prior to said patterning of said diffusion barrier layer.

15. The method of claim 14, wherein patterning said diffusion barrier layer includes a plasma etch process that maintains said substrate at a third substrate temperature that is less than said substrate temperature during said removing.

16. The method of claim 14, furthering including performing a second physical etch clean-up process in said second chamber to remove a nitride-containing residue, formed on sidewalls of said patterned conductive and ferroelectric material layers, as a byproduct of said patterning of said diffusion barrier layer.

17. A method of manufacturing a ferroelectric memory cell, comprising:
   forming one or more transistors on a semiconductor substrate;
   depositing a pre-metal dielectric layer over said transistors;
   fabricating a ferroelectric capacitor on said semiconductor substrate, wherein said ferroelectric capacitor is electrically coupled at least one of said transistors, including:
      forming conductive and ferroelectric material layers on said pre-metal dielectric layer; and
      patterning said material layers to form upper and lower electrodes and a ferroelectric layer of said ferroelectric capacitor, wherein a conductive residue is generated on sidewalls of said ferroelectric capacitor as a byproduct of said patterning; and
   removing said conductive residue using a physical plasma etch clean-up process that includes $BCl_3$ as a feed gas, wherein said patterning and said removing are performed in a same first chamber.

18. A method of manufacturing a ferroelectric memory cell, comprising:
   forming one or more transistors on a semiconductor substrate;
   depositing a pre-metal dielectric layer over said transistors;
   forming contacts in said pre-metal dielectric layer, wherein said contacts touch at least one of said transistors;
   forming a diffusion barrier layer on said pre-metal dielectric layer and on said contacts;
   fabricating a ferroelectric capacitor on said diffusion barrier layer, wherein said ferroelectric capacitor is electrically coupled to at least one of said transistors, including:
      forming conductive and ferroelectric material layers on said pre-metal dielectric layer; and
      patterning said material layers to form upper and lower electrodes and a ferroelectric layer of said ferroelectric capacitor, wherein a conductive residue is generated on sidewalls of said ferroelectric capacitor as a byproduct of said patterning; and
   removing said conductive residue using a physical plasma etch clean-up process that includes $BCl_3$ as a feed gas, wherein
   said patterning and said removing are performed in a same first chamber, and
   said patterning and said removing are completed prior to a second patterning of said diffusion barrier layer in a second chamber.

* * * * *